(12) United States Patent
Vaughn

(10) Patent No.: US 6,448,697 B1
(45) Date of Patent: Sep. 10, 2002

(54) PIEZOELECTRIC DEVICE HAVING INCREASED MECHANICAL COMPLIANCE

(75) Inventor: Gary Vaughn, Albuquerque, NM (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/750,991

(22) Filed: Dec. 28, 2000

(51) Int. Cl.[7] ............................................. H01L 41/04
(52) U.S. Cl. ..................................................... 310/348
(58) Field of Search ............................... 310/348, 351, 310/352, 353

(56) References Cited

U.S. PATENT DOCUMENTS

| | | | |
|---|---|---|---|
| 3,437,849 A | * | 4/1969 | Treatch et al. .............. 310/346 |
| 3,931,388 A | * | 1/1976 | Hafner et al. ............... 310/348 |
| 4,561,286 A | * | 12/1985 | Sekler et al. .............. 73/24.06 |
| 6,236,145 B1 | * | 5/2001 | Biernacki .................... 310/346 |

* cited by examiner

Primary Examiner—Nestor Ramirez
Assistant Examiner—Peter Medley
(74) Attorney, Agent, or Firm—Nelson Nolte

(57) ABSTRACT

The present invention provides a method of mounting a piezoelectric device having a plurality of mounting pads directly to a printed circuit board comprising the steps of providing a piezoelectric device, miniature conductive springs and a printed circuit board, attaching the springs to mounting pads of the piezoelectric transformer, and attaching the springs to the printed circuit board. Also disclosed is an apparatus made according to the method.

6 Claims, 1 Drawing Sheet

PIEZOELECTRIC DEVICE HAVING INCREASED MECHANICAL COMPLIANCE

TECHNICAL FIELD

The present invention relates to mounting piezoelectric devices. More particularly the present invention relates to mounting a piezoelectric transformer to a printed circuit board with a coil spring in order to increase mechanical compliance.

BACKGROUND OF THE INVENTION

The miniaturization of circuits and components remains a top priority in most electronic industries. The miniaturization of solid-state components and combination-type circuitry chips, such as central processor units, digital signal processors, memory, etc., has been so successful that the packaging and electrical connections for access to such small devices has become one of the major roadblocks for further miniaturization. One of the packaging problems for some types of miniaturization circuits, such as for piezoelectric devices, is how to both support the piezoelectric device and make electrical connections without adversely affecting the operation and performance.

A piezoelectric transformer transfers energy through acoustic vibration. At the resonance frequency of the piezoelectric transformer a vibrational standing wave exists in the device which defines nodes and anti-nodes of the standing wave. Efficient piezoelectric transformers resonate with a very high mechanical Q. Any mechanical dampening of the vibration of the piezoelectric transformer reduces the Q and decreases the efficiency of the transformer. Practical application of the piezoelectric transformer normally requires that the device be attached to a printed circuit board and that three or four electrical connections be made to the printed circuit board. Therefore, it is necessary to mount the piezoelectric transformer in a manner that minimizes mechanical stress on the piezoelectric transformer in order to maximize efficiency.

Prior art mounting techniques often included the use of silicon-type adhesives or double-sided tapes for mounting the piezoelectric device to a printed circuit board. Such techniques offer some stability against g-forces, rotational and torsional forces, but dampen the vibrational force of the piezoelectric transformer. In many instances these prior art mounting techniques are unacceptable because the mechanical and electrical attachments of the piezoelectric transformer to the printed circuit board become fractured as a result of the fact that vibrational stresses are concentrated at these portions. Additionally, these prior art mounting methods reduce the efficiency of the piezoelectric transformer by 3–5%.

Therefore, it would be advantageous to provide a simple and inexpensive method for flexibly mounting a piezoelectric device on a printed circuit board in order to minimize mechanical dampening of the vibration of the piezoelectric device.

SUMMARY OF THE INVENTION

The present invention solves the problem of the prior art by providing controlled mechanical compliance in all directions. The compliance may be adjusted by varying the spring height, material, coil and wire diameter and coil spacing. Springs with approximately the same coil diameter as the transformer pads can be attached to the piezoelectric transformer.

The present invention provides a method of mounting a piezoelectric device having a plurality of mounting pads directly to a printed circuit board comprising the steps of providing a piezoelectric device, miniature conductive springs and a printed circuit board, attaching the springs to mounting pads of the piezoelectric transformer, and attaching the springs to the printed circuit board. Also disclosed is an apparatus made according to the method.

DETAILED DESCRIPTION OF THE PREFERRED EMBODIMENT

Figure 1:
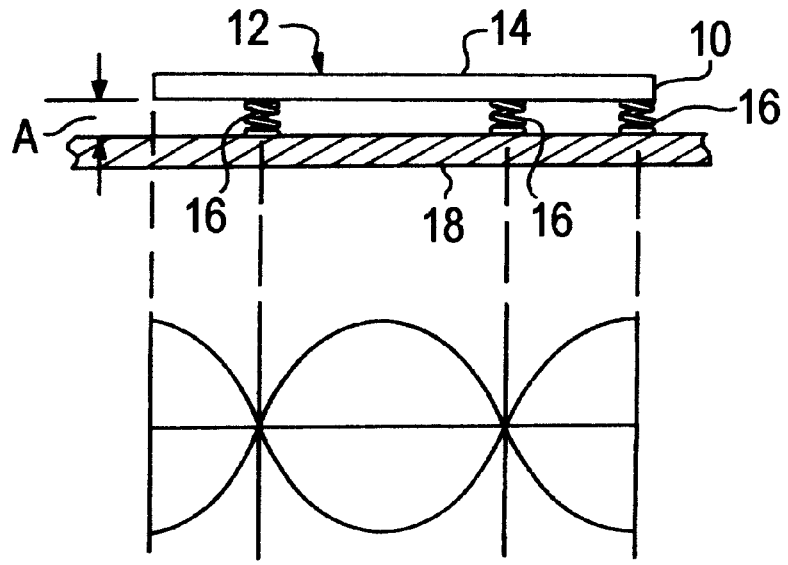
FIG. 1 is a perspective view of a piezoelectric transformer having springs attached thereto according to a preferred embodiment of the present invention.
Figure 2:
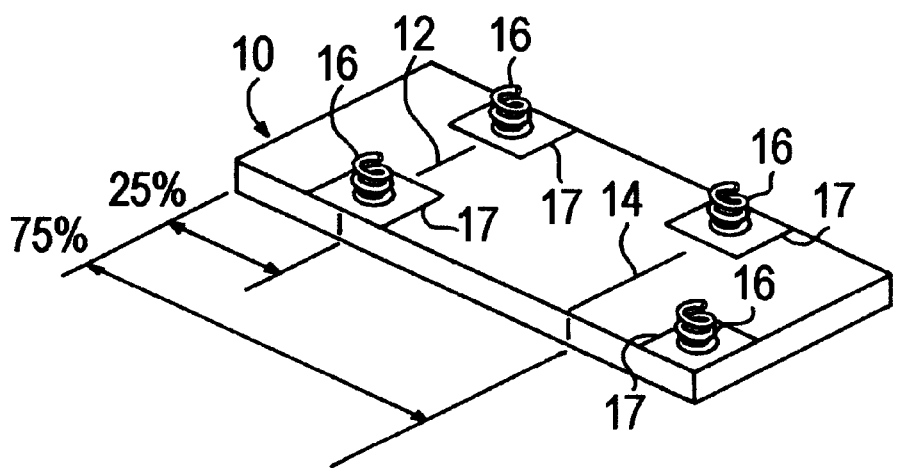
FIG. 2 is a side view of a piezoelectric transformer attached to a printed circuit board according to a preferred embodiment of the present invention and a graph of vibrational displacement of the piezoelectric transformer versus position.

Referring to FIGS. 1 and 2, there is shown a piezoelectric transformer 10. The piezoelectric transformer 10 is a Rosen or modified Rosen style operating in a one-lambda length resonance mode. As a result, the transformer 10 will have first and second minimum displacement nodes 12, 14 located at approximately 25% and 75% of the transformer's length. Two electrical connections and a mechanical connection are normally made at the first minimum displacement node 12. A second mechanical mounting and an optional feedback electrical connection are normally made at the second minimum displacement node 14. An output electrical connection must be made on the end of the device, which is a displacement maximum and is extremely sensitive to mechanical dampening. The present Rosen style piezoelectric transformer is shown by way of example and not intended as a limitation. Other transformer styles and other piezoelectric devices may have different geometries and may operate in different modes without departing from the scope of the present invention.

Referring to FIG. 2, the present invention uses electrically conductive, miniature metal compression springs 16 to realize both electrical connection and mechanical mount. The dimensions and compliance of the springs 16 are selected to match the requirements of the transformer 10. Spring characteristics vary with the size of the piezpelectric transformer 10, such that larger piezoelectric transformers 10 require larger springs 16, larger pads can accommodate larger spring diameters, different vibrational frequencies require springs with different spring constants. Additionally the pitch and number of coils of the spring 16 determine a distance A that the piezoelectric transformer 10 is spaced away from a printed circuit board 18 to which the piezoelectric transformer 10 is mounted.

When the piezoelectric transformer 10 has four electrical connections, as described above, at least four springs 16 would be used. The springs 16 are attached to metallized pads 18 of the piezoelectric device 10 by solder. Preferably, the springs 16 are attached to mounting pads 17 of the piezoelectric device 10 before the springs are attached to the printed circuit board. Next, the springs 16 are attached to the printed circuit board by soldering. In some cases the solder connection will be facilitated by the use of a feedthrough via in the printed circuit board. In this manner the springs 16 act as a compliant mechanical connection and electrical connection of the piezoelectric transformer to the printed circuit board 18. It is also contemplated that a conductive epoxy could be used to attached the springs to the piezoelectric device and the printed circuit board in place of solder.

While the specific embodiment has been illustrated and described, numerous modifications come to mind without departing from the spirit of the invention. The scope of protection is only limited by the scope of the accompanying claims not the specific embodiment of those claims described above.

I claim:

1. A device capable of being attached to a printed circuit comprising:

a piezoelectric device having a plurality of mounting pads, the piezoelectric device operating in a resonance mode with vibrational standing waves existing in the piezoelectric device; and at least three miniature, conductive, coil springs having one end attached to the piezoelectric device, wherein only one coil spring is attached to the piezoelectric device an end of the piezoelectric device, the end being a maximum displacement node of the piezoelectric device, and wherein the other coil springs are attached to at least one minimum displacement node of the piezoelectric device.

2. The device of claim 1 wherein the coil springs are attached to the piezoelectric device and the printed circuit board to realize both electrical connection and mechanical mount.

3. The device of claim 2 wherein the coil springs are the only electrical connection and the only mechanical mount of the piezoelectric device to the printed circuit board.

4. The device of claim 1 wherein the device has four coil springs, wherein two of the other coil springs are attached to the piezoelectric device at a first minimum displacement node of the piezoelectric device, and one of the other coil springs is attached to the piezoelectric device at a second minimum displacemen of the piezoelectric device.

5. The device of claim 4 wherein the coil springs are the only electrical connection and the only mechanical mount of the piezoelectric device to the printed circuit board.

6. The device of claim 1 wherein the coil springs are the only electrical connection and the only mechanical mount of the piezoelectric device to the printed circuit board.

* * * * *